United States Patent
Watanuki et al.

(10) Patent No.: US 7,346,871 B2
(45) Date of Patent: Mar. 18, 2008

(54) METHOD OF ESTIMATING WIRING COMPLEXITY DEGREE IN SEMICONDUCTOR INTEGRATED CIRCUIT

(75) Inventors: Fumihito Watanuki, Tama (JP); Eiji Nagata, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 161 days.

(21) Appl. No.: 11/299,757

(22) Filed: Dec. 13, 2005

(65) Prior Publication Data
US 2006/0124968 A1 Jun. 15, 2006

(30) Foreign Application Priority Data
Dec. 13, 2004 (JP) ............... P2004-360197

(51) Int. Cl.
*G06F 17/50* (2006.01)
(52) U.S. Cl. .............................. 716/5; 716/1
(58) Field of Classification Search .......... 716/4–6, 716/15, 1
See application file for complete search history.

(56) References Cited
U.S. PATENT DOCUMENTS
6,182,271 B1   1/2001  Yahagi et al.
7,114,140 B2*  9/2006  Ishikura ................. 716/8
7,155,684 B2* 12/2006  Kusumoto ............... 716/1
2003/0051218 A1*  3/2003  Kumagai .................. 716/8
2004/0031004 A1*  2/2004  Yoshioka ................. 716/7

FOREIGN PATENT DOCUMENTS
JP    05-174091    7/1993
JP    09-045776    2/1997
JP    10-261719    9/1998

* cited by examiner

*Primary Examiner*—Jack Chiang
*Assistant Examiner*—Binh Tat
(74) *Attorney, Agent, or Firm*—McDermott Will & Emery LLP

(57) ABSTRACT

A method of estimating a wiring complexity degree in a semiconductor integrated circuit with a multi-layered wiring, which has a wiring structure including at least two layers or more, in laying signal wirings, includes a step of predicting a power-supply wiring space used in the semiconductor integrated circuit, a step of dividing the predicted power-supply wiring space onto respective wiring layers, and a step of estimating a complexity degree at a time of laying signal wirings, based on the predicted power-supply wiring space and a wiring specification in respective wiring layers every wiring layer.

8 Claims, 8 Drawing Sheets

MACROBLOCK

METHOD OF ESTIMATING WIRING COMPLEXITY DEGREE IN SEMICONDUCTOR INTEGRATED CIRCUIT

BACKGROUND OF THE INVENTION

1. Field of the Invention

The present invention relates to a method of estimating a complexity degree of signal wirings in a semiconductor integrated circuit and, more particularly, the technology that is capable of estimating a complexity degree of wirings used to connect integrated circuits with high precision at an early stage to define an available space of the integrated circuit.

2. Description of the Related Art

Recently the semiconductor integrated circuit (referred to as an "LSI" hereinafter) is incorporated into various products. In order to clarify a development cost of LSI, a space of LSI (referred to as a "chip size" hereinafter) must be defined at the earliest possible stage of layout design. In order to define the chip size, physical placement positions in the integrated circuit must be decided, then power-supply wirings for supplying a power must be laid, then wirings for connecting the integrated circuits (referred to as "signal wirings" hereinafter) must be connected, then an available space including up to physical wiring spaces must be checked.

Meanwhile, in order to check the available space including up to the physical wirings, the process must go ahead to the signal wiring stage in LSI design. In some cases a wiring complexity due to a lack of wiring space is caused at last locally or totally at the final stage. At that time, such a situation sometimes occurs that the layout design must be carried out once again from the beginning. By the way, as the method of checking the complexity degree at the time of laying the wirings, there exists the approach of dividing the inside of LSI into plural lattices after the integrated circuits are placed, then applying virtual wirings to connect the integrated circuits at a shortest distance, and then checking how many wirings are present in respective lattices (see Patent JP-A-5-174091).

As seen in JP-A-5-174091, the approach in the prior art checks whether or not a space necessary for the signal wirings are assured, by applying the automatic placement of the integrated circuits and then laying the virtual signal wirings in the LSI layout step. Such approach is effective when a wiring space required to supply a power to the integrated circuits is small and also a time required to lay the power supply wirings is negligibly small rather than a time required for the placement and the virtual wiring provision.

However, a scale of the integrated circuit is increased in the recent LSI. Accordingly, a space required to lay the power-supply wirings for supplying a power to insides of the circuits tends to increase remarkably. Also, a design term required to lay the power-supply wirings also tends to increase remarkably with an increase of the power-supply wiring laying space.

Under such circumstances, even though a space necessary for all wirings is estimated only based on the space required for the signal wirings without regard to the wiring spaces that are needed to supply the power to the integrated circuits as an LSI space including the wirings, a space enough to lay the signal wirings cannot be secured when the signal wirings are provided after the step goes finally to the laying of the power-supply wirings. This is because a space error caused to pay no regard to an increase of a power-supply wiring space is generated. Thus, such a problem has arisen sometimes that the modification of the placement positions of the integrated circuits or the modification of the chip size must be made.

Also, if it is intended to estimate a complexity degree of the signal wirings after the laying of the power-supply wirings were completed, a time required for one-time provision of the power-supply wirings is increased as described above. Therefore, a lot of times are consumed until the estimation of a wiring complexity degree is carried out after the power-supply wirings were laid and then the signal wirings were connected. Also, according to the result of the complexity degree, such a situation is supposed that modifications such as a modification of the integrated circuit placement, and the like should be applied. At that time, a term to lay the power-supply wirings is needed once again, and thus such a problem existed that a term required to define the LSI space is prolonged.

However, assume that a space required for laying the power-supply wirings can be forecasted previously, a complexity degree of the signal wirings can be estimated with good precision before the power-supply wirings are laid actually if the wiring space required for laying the power-supply wirings is deleted automatically in advance from the wirable space of the signal wirings. According to this, a term required to estimate a wiring complexity degree can be reduced. In other words, the conventional approach is uncertain in checking whether or not the layout design can be carried out within the present LSI space with regard to the signal wiring space. Thus, in some cases a term required until the complexity degree can be estimated is increased excessively.

SUMMARY OF THE INVENTION

It is an object of the present invention to attain a decision of an LSI space including up to wiring spaces, which cannot be defined after signal wirings are connected in the layout stage, more precisely and at an early stage.

The present invention provides a method of estimating a wiring complexity degree in a semiconductor integrated circuit with a multi-layered wiring that has a wiring structure including at least two layers or more in laying signal wirings, which includes a step of predicting a power-supply wiring space used in the semiconductor integrated circuit; a step of dividing the predicted power-supply wiring space onto respective wiring layers; and a step of estimating a complexity degree at a time of laying signal wirings, based on the predicted power-supply wiring space and a wiring specification in respective wiring layers every wiring layer.

In this method, since the space required to lay the power-supply wirings is estimated, a power-supply wiring laying term required to execute the estimation of the wiring complexity can be reduced, and also the complexity degree of the signal wirings can be estimated while keeping an equivalent precision attained when the power-supply wiring laying space is calculated.

Also, in the method of estimating the wiring complexity degree in the semiconductor integrated circuit of the present invention, the estimating step is the step of generating virtual power-supply wirings as a signal wiring inhibiting area based on the wiring specification in respective wiring layers, and estimating the complexity degree at the time of laying the signal wirings based on a size of the signal wiring inhibiting area.

Accordingly, the power-supply wiring laying term required to execute the estimation of the wiring complexity can be reduced, and also the complexity degree of the signal wirings can be estimated while keeping an equivalent precision attained when the power-supply wiring laying space is calculated.

In the method of estimating the wiring complexity degree in the semiconductor integrated circuit of the present invention, the input power-supply wiring space is divided into the power-supply spaces in respective layers used in laying respective power-supply wirings. In order to take the spaces of the power-supply wirings into consideration more exactly, there is the approach of allocating the power-supply space using a ratio that corresponds to the power-supply wiring width in respective wiring layers, as the approach of allocating the predictive power-supply space to respective wiring layers. If these approaches are selectively used appropriately according to the situation, the complexity degree of the signal wirings can be estimated with higher precision.

Also, in the method of estimating the wiring complexity degree in the semiconductor integrated circuit of the present invention, normally basic logical circuits such as NOR, NAND, inverter, flip-flop, etc. are referred to as the "cell" of the integrated circuit, and also circuit blocks or memories (referred collectively to as the macroblock in the present claim) having predetermined functions by using plural cells or transistors in combination are referred to as the "block". If the wiring spaces that the macroblocks have in the inside are extracted from the library and then such wiring spaces are deleted from the input power-supply wiring spaces, the estimation of the wiring complexity degree, in which even the wiring spaces in the macroblocks are taken into consideration, can be carried out with high precision.

Also, in the method of estimating the wiring complexity degree in the semiconductor integrated circuit of the present invention, when the signal wiring laying routes are decided previously by the wiring specification (referred to as "wiring tracks" hereinafter), the estimation of the complexity degree can be executed by deleting previously the wiring tracks, which are supposed not to be used due to the presence of the power-supply wirings, and then applying the signal wirings, as the approach of considering the power-supply wirings. In this manner, since the wiring tracks are deleted in advance, the method of the present invention can respond flexibly even when the step of replacing the macroblocks, or the like is needed.

Also, a wiring space ratio obtained by dividing the wiring spaces used to connect the signal wirings by an overall wirable space in the LSI is defined, then the predicted occupation ratio is input, then the predicted power-supply wiring space is excluded from the wirable space of LSI, then it is decided whether or not the wiring occupation ratio used in the signal wiring as a signal wiring occupation ratio in which the power-supply wiring space is considered exceeds the predicted value to specify the excessively insufficient wiring layer, and then the result can be reflected on the space division to respective wiring layers required for the actual power-supply wiring laying.

According to the present invention, the power-supply wiring space is estimated every layer, and then the complexity degree of the signal wirings is estimated. Therefore, the LSI chip size including up to the spaces of the signal wirings can be estimated more precisely and early.

Also, in the case where the space necessary for the connection of the signal wirings is not enough and thus the placement position of the macroblocks, or the like is changed to modify the wiring specification, or the like, the step of laying the power-supply wirings is not needed in estimating the wiring complexity degree once again, and the complexity degree of the signal wirings can be estimated while taking account of the laying spaces of the power-supply wirings and the wiring shapes. Therefore, the method of the present invention can respond flexibly and early to such situation. As a result, the term itself required for the LSI development can be reduced.

DESCRIPTION OF THE PREFERRED EMBODIMENTS

Embodiment 1

Figure 1:
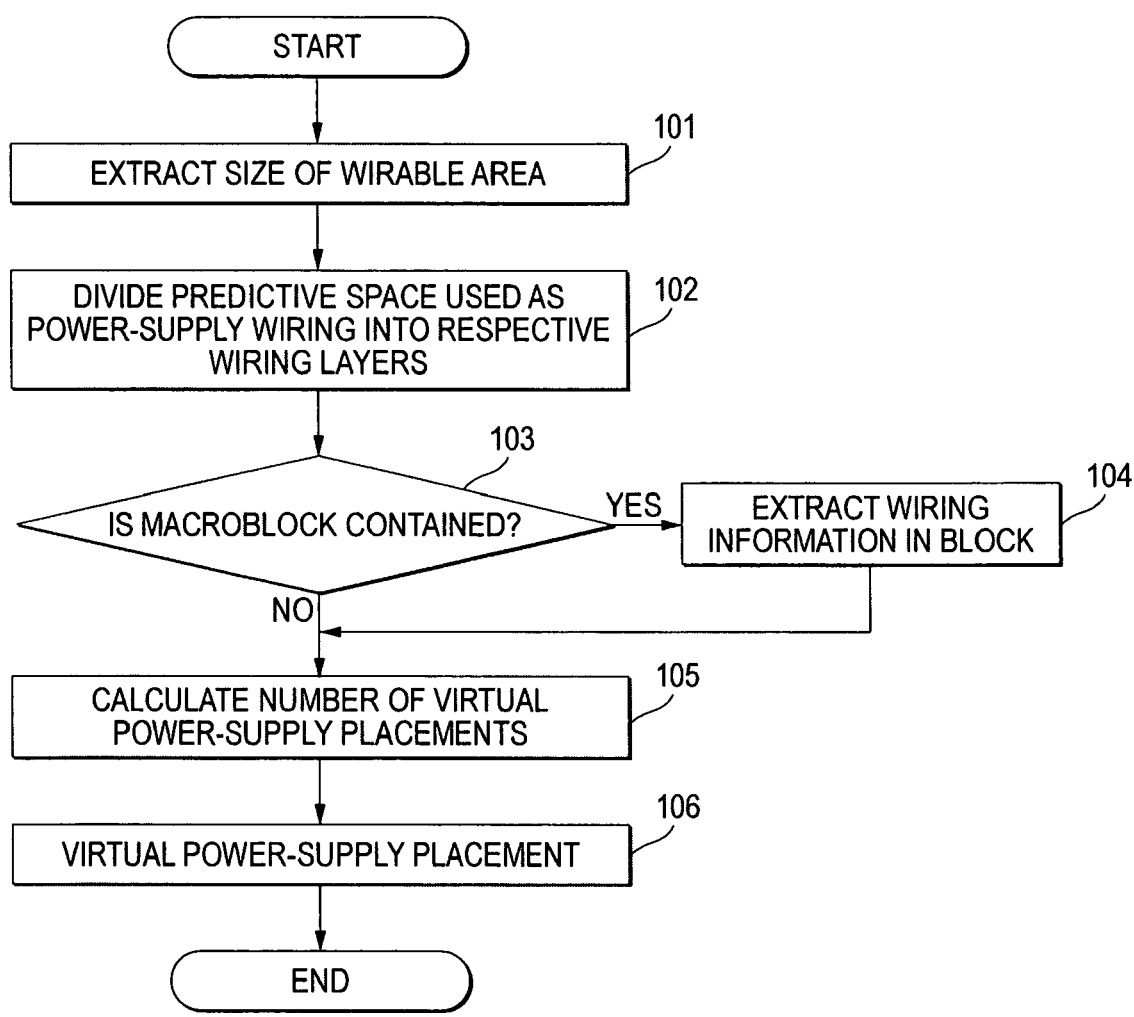
FIG. 1 is a block diagram showing a configuration of a flow in forming virtual power-supply wirings in embodiments of the present invention.

A function and an operation of generating virtual power-supply wirings to estimate a complexity degree of signal wirings with high precision will be explained concretely hereunder. FIG. 1 is a flowchart showing operational procedures of generating the virtual power-supply wirings. As shown in FIG. 1, first a wirable area from which the areas such as terminal area, and the like, on which the wiring cannot be laid, are removed is extracted from input layout information of LSI (step 101). Here, a width and a height of the wirable area are set to H and L respectively.

Then, an input predictive power-supply space Sp is divided onto respective wiring layers to which the power-supply wiring is applied, based on information of the wiring layer used as the power-supply wiring (step 102). At this time, as the method of calculating the power-supply space Sp(n) used in each layer, the predictive power-supply space Sp is divided equally by $Sp(n)=Wp/n$, where n is the total number of the used power-supply wirings.

Then, in step 103, it is decided whether or not macroblocks are contained in the LSI as the object. In this embodiment, explanation will be made under the assumption that no macroblock is contained. The case where the macroblocks are contained will be explained later in Embodiment 3.

Then, the number Np(n) of virtual power-supply wirings every wiring layer is calculated by $Np(n)=W(n)/L$ using a length (above H or L) in the wiring direction, which is decided according to the wiring specification of each wiring layer. At this stage, the shape and the number of figure data used as the virtual power-supply wiring are decided (step 105). Then, the virtual power-supply wiring having a width Wp and a length L (or H) is formed in the wirable area of the LSI up to the number Np(n). The internal area of the virtual power-supply wiring has the property that such internal area cannot be used as the connecting area of the signal wirings. The virtual power-supply wiring is generated every wiring layer used as the power-supply wirings (step 106).

Figure 2:
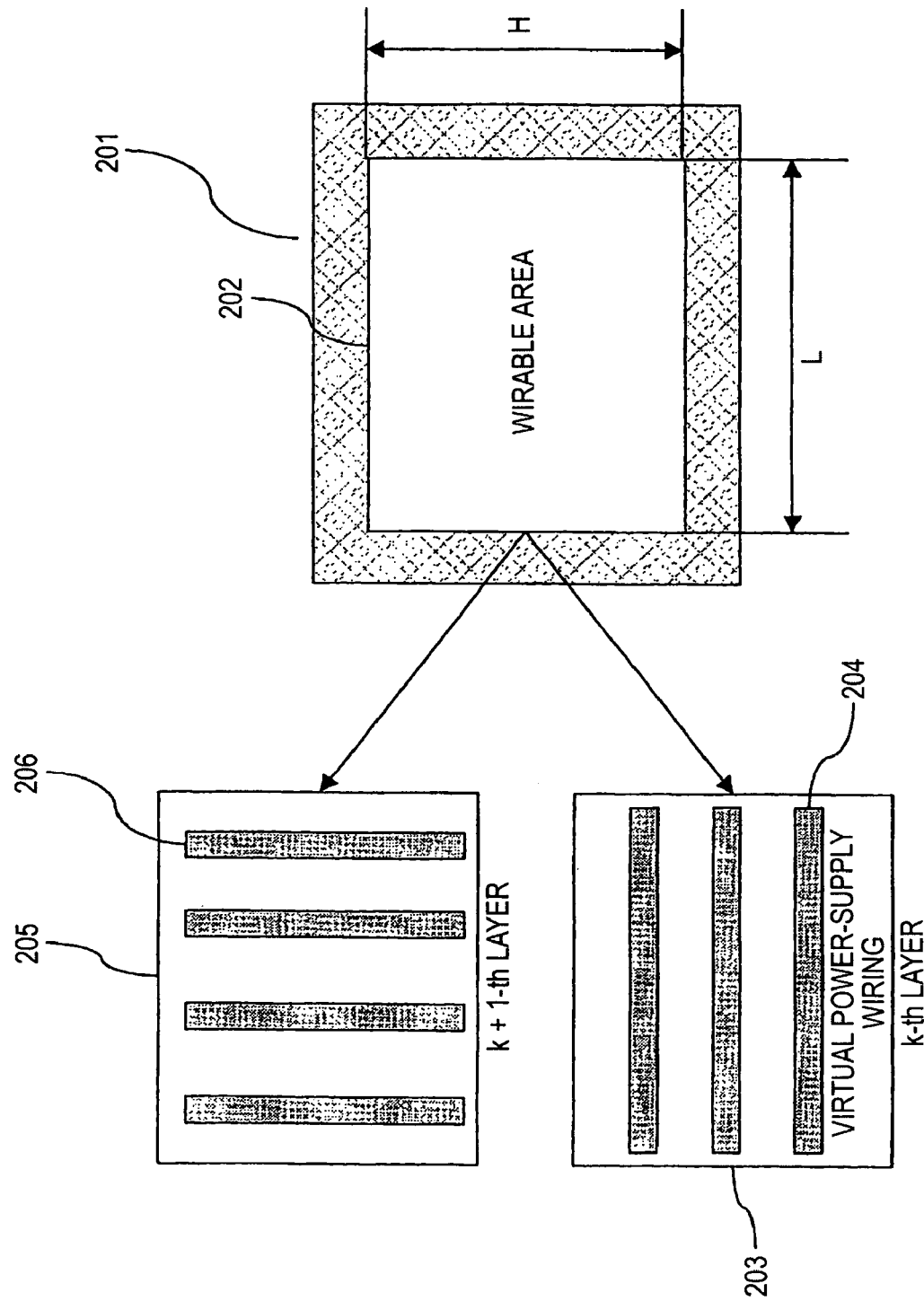
FIG. 2 is a layout view explaining a formation of the virtual power-supply wirings in Embodiment 1 of the present invention.

FIG. 2 is a view explaining particularly a method of forming the virtual power-supply wirings in FIG. 1.

A numeral 201 in FIG. 2 denotes an overall space of LSI, and a numeral 202 denotes a total space in which the signal and power-supply wirings can be laid in the overall space 201. Also, the wirable area 202 is stacked every wiring layer.

Numerals 203 and 204 denote a wiring layer used in laying the power-supply wirings and having the same height H and length L as the space 202 respectively. In the present embodiment, two layers are used as the power-supply wiring and are denoted as the k-th layer and the k+1-th layer.

First, in the present embodiment, under the assumption that a width of the power-supply wiring is represented by the same value Wp every wiring layer, the predictive whole power-supply space Sp is divided into power-supply spaces Sp(k)=Sp/n and Sp(k+1)=Sp/n of respective power-supply wiring layers (Sp(k)=Sp(k+1)). Then, as the virtual power-supply wirings each having a width Wp and a length L, the divided power-supply spaces in respective wiring layers are placed in the wirable area at an equal interval up to the number given by Np(k)=Sp(k)/(Wp×L) while using a width of the power-supply wiring in each layer and the preferential wiring direction decided by the wiring specification (in FIG. 2, L shows the preferential wiring direction in the k-th layer). Also, the virtual power-supply wirings are placed on the k+1-th layer up to the number that is obtained by using same calculating approach.

Figure 3:
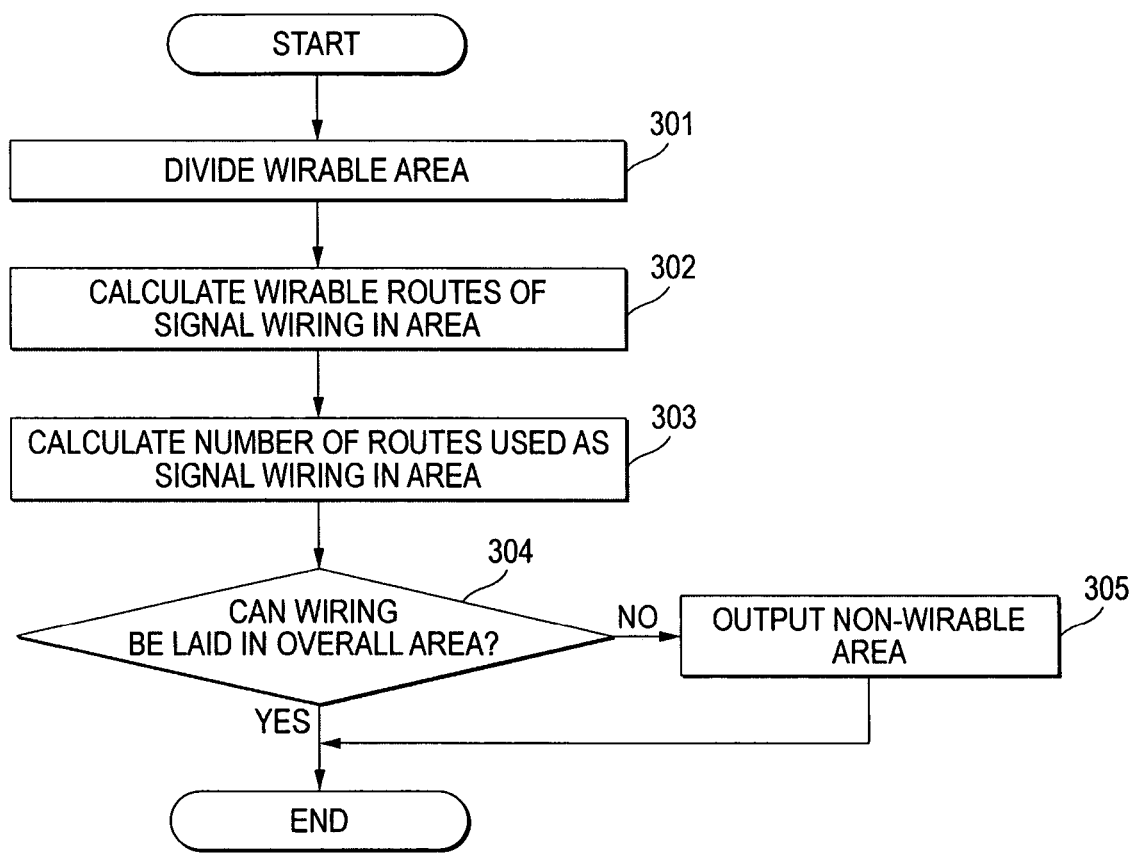
FIG. 3 is a block diagram showing a configuration of a flow in estimating a wiring complexity degree in Embodiment 1 of the present invention.

FIG. 3 is a flowchart showing procedures of the operation to calculate a wiring complexity degree after the signal wirings are connected.

First, the wirable area in LSI is divided into several areas (step 301). This operation is selectively executed mainly to reduce a processing load in one time in the operation to calculate numerically the wiring complexity and carry out the process smoothly.

Then, wirable route information is calculated in respective divided areas. At first, the minimum wiring interval D and the preferential wiring direction of each layer, which are decided from the wiring specification being already specified, are extracted from the inside of the wirable area. Then, the number of routes is calculated in the preferential wiring direction in the wirable area to know how many signal wirings with the interval D can be connected in the wirable area. At that time, when the virtual power-supply wirings generated in step 106 in FIG. 1 are present in the wirable area, the space from which the virtual power-supply wiring space existing in the area is deleted is derived and then wirable routes of the signal wiring are calculated based on the value (step 302).

Then, the number of the signal wirings existing actually in the area is extracted every wiring layer (step 303). Then, a difference from the number of wirable tracks is calculated to decide whether or not the number of signal wiring routes that exist actually exceeds the number of wirable routes (step 304). If the actual number of signal wiring routes exceeds the number of wirable tracks, a report indicating in which area and which layer the actual number exceeds the number of wirable tracks is output (step 305).

According to this operation, the wiring complexity in the area can be extracted as the numerical value and thus it is possible to decide whether or not the signal wirings can be connected in this area by the existing floor plan. Similar operations are applied to respective areas.

Since complexity degrees of respective areas calculated in this manner are output, the complexity degree of the signal wirings can be estimated while considering up to the power-supply wiring space without a particular term needed to lay the power-supply wirings.

If the modification of the floor plan is needed once again, modifications such as enlargement/reduction of a chip size, a change of the macroblock placement position, and like are made appropriately based on the output information of the complexity degree and also the process of estimating the complexity degree of the signal wirings is repeated again until the signal wirings can be satisfactorily connected. In the prior art, in order to estimate the wiring complexity degree with same precision, the step of laying the power-supply wiring must be carried out every time. In contrast, in the method of the present invention, since the virtual power-supply wiring can be laid automatically based on the predictive power supply space, the step of laying the power-supply wiring is not needed.

In this case, the wirings between the cells are laid in the connecting step based on the connectivity information between the cells and the physical wiring specification after the wiring complexity degree is estimated. At that time, the wirings are connected such that a distance from the generated virtual power-supply wirings and other wirings is not reduced smaller than a minimum interval that is decided by the physical wiring specification.

Embodiment 2

In the present embodiment, a function and an operation of generating the virtual power-supply wirings to estimate a complexity degree of signal wirings with higher precision than Embodiment 1 will be explained concretely hereunder. FIG. 1 is the flowchart showing operational procedures of generating the virtual power-supply wirings. As shown in FIG. 1, first the wirable area is extracted from the input layout information of LSI (step 101). Here, the width and the height of the wirable area are set to H and L respectively.

Then, the input predictive power-supply space Sp is divided onto respective wiring layers to which the power-supply wiring is applied, based on information of the wiring layer used as the power-supply wiring (step 102). At this time, as the method of calculating the power-supply space Sp(n) used in each layer, the space that is in proportion to the power-supply width is allocated to respective wiring layers by Sp(n)=Sp×Wp(n)/n, where Wp(n) is the input predictive power-supply wiring space of each layer and n is the total number of the used power-supply wirings.

Subsequently, the formation of the virtual power-supply wirings and the approach of estimating the complexity degree of the signal wirings are carried out similarly to Embodiment 1.

Embodiment 3

Next, Embodiment 3 of the present invention will be explained hereunder. In the present embodiment, the approach of estimating the complexity degree of the signal wirings when the macroblock is present in the LSI, in addition to Embodiment 1, will be explained concretely hereunder. FIG. 1 is the flowchart showing operational procedures of generating the virtual power-supply wirings. As shown in FIG. 1, first the wirable area is extracted from the input layout information of LSI (step 101). Here, the width and the height of the wirable area are set to H and L respectively.

Then, the input predictive power-supply space Sp is divided onto respective wiring layers to which the power-supply wiring is applied, based on information of the wiring layer used as the power-supply wiring (step 102). At this time, as the method of calculating the power-supply space $Sp(n)$ used in each layer, the value of the power-supply space $Sp(n)$ is calculated by dividing the predictive power-supply space Sp into the power-supply spaces in respective wiring layers while using the method in Embodiment 1 or 2.

Figure 4:
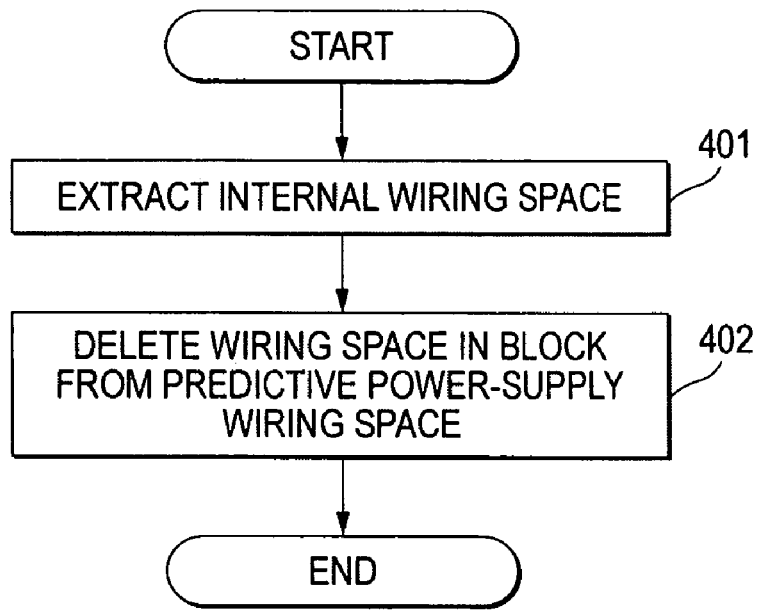
FIG. 4 is a block diagram showing a configuration of a flow in extracting an wiring space in a macroblock in Embodiment 3 of the present invention.

Next, an approach of deleting the wiring space in the macroblock existing in the LSI from the power-supply space $Sp(n)$ in respective wiring layers will be explained hereunder. FIG. 4 is a flowchart showing operational procedures of the function of extracting the wiring space $Sm(n)$ in the macroblock and deleting the wiring space $Sm(n)$ from the power-supply space $Sp(n)$ calculated in step 104 in FIG. 4. First, a sum $S(n)$ of the wiring spaces in respective wiring layers is calculated from the macroblock library. The same operation is applied to all macroblocks in the LSI, and then a sum of $S(n)$ taken in respective wiring layers in all macroblocks is set as $Sm(n)$ (step 401). Then, a value obtained by subtracting $Sm(n)$ from $W(n)$ is calculated (step 402). The process in step 105 in FIG. 1 is executed by using the value, and then the process is ended.

Figure 5:
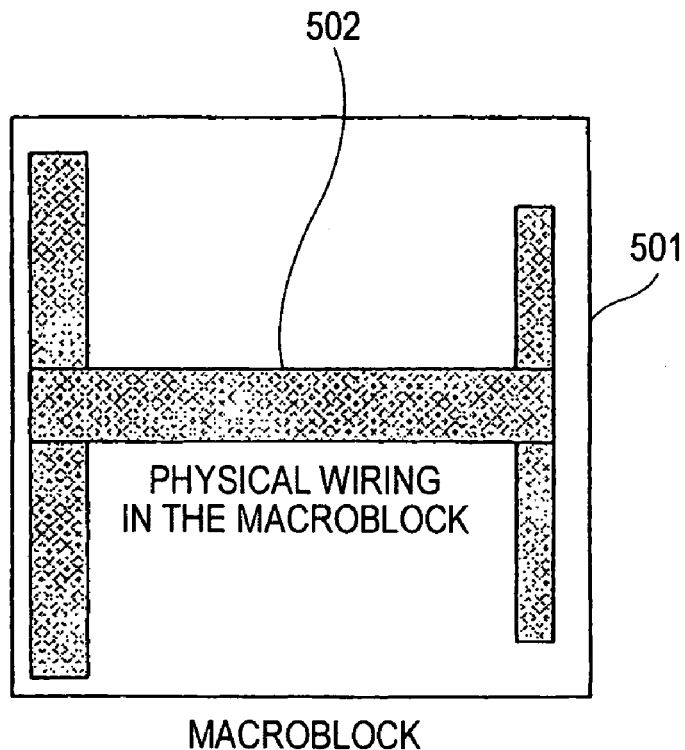
FIG. 5 is a layout view explaining an extraction of the wiring space in the macroblock in Embodiment 3 of the present invention.

FIG. 5 is a view explaining concretely the extraction of the wiring space in the macroblock in FIG. 4. Actually the information (502 in FIG. 5) of physical shapes of the power-supply wirings and the signal wirings are held in a macroblock 501 in the form of a library, or the like. A total sum of all wiring spaces every wiring layer is set as $Sm(n)$ from the library.

Subsequently, the formation of the virtual power-supply wirings and the approach of estimating the complexity degree of the signal wirings are carried out by using the value of $Sm(n)$ in the same way as Embodiment 1.

Embodiment 4

Figure 6:
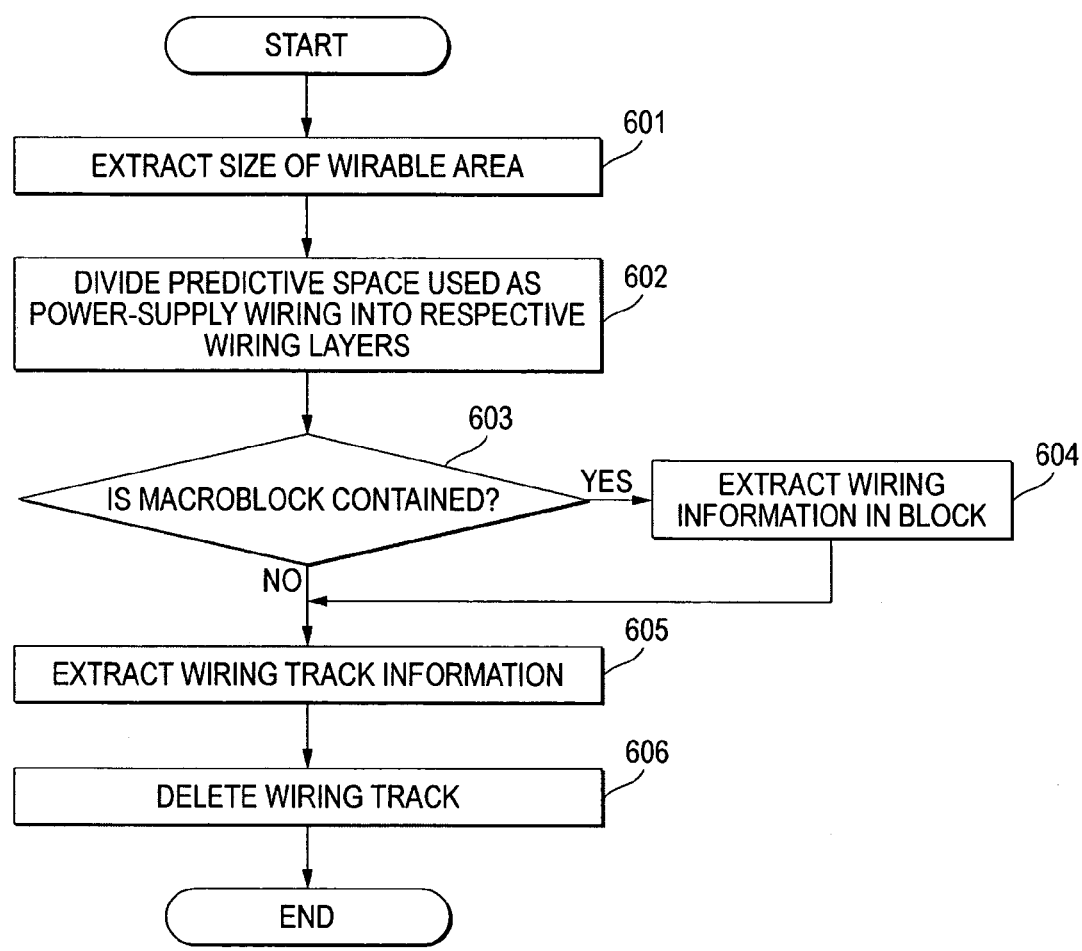
FIG. 6 is a block diagram showing a configuration of a flow in deleting signal wiring routes in Embodiment 4 of the present invention.

In the present embodiment, the approach of estimating the complexity degree of the signal wirings not to use of the virtual power-supply wirings with regard to the power-supply wiring space when wiring tracks decided by the wiring specification are present will be explained hereunder. FIG. 6 is a flowchart showing operational procedures of deleting the wiring tracks. As shown in FIG. 6, first the wirable area is extracted from the input layout information of the LSI (step 601). Here, the width and the height of the wirable area are set to H and L respectively.

Then, the input predictive power-supply space Sp is divided onto respective wiring layers to which the power-supply wiring is applied, based on information of the wiring layer used as the power-supply wiring (step 602). At this time, as the method of calculating the power-supply space $Sp(n)$ used in each layer, the predictive power-supply space Sp is divided equally by $Sp(n)=Wp/n$ using the total number n of the used power-supply wirings.

Then, in step 603, it is decided whether or not the macroblock is contained in the LSI as the object. In this embodiment, explanation will be made under the assumption that no macroblock is contained. The case where the macroblock is contained will be explained later in Embodiment 6.

Then, the lowest minimum wiring interval (interval of the wiring track) Dn, at which the signal wiring can be connected, and the preferential wiring direction of each wiring layer are extracted from the definition of the wiring specification in respective wiring layers (Either L or H used in calculating $Ns(n)$ used hereunder is decided according to the preferential wiring direction. Here, for convenience, explanation will be made by using a symbol L throughout the following description). Then, the number of wirable routes of each wiring layer is calculated by using the integer portion of $Ns(n)=L/D(n)$ as $Ns(n)$ of each wiring layer (step 605).

Then, the number $Np(n)$ of unusable wiring tracks in the predictive power-supply wiring space is calculated as the integer portion of $Np(n)=Sp(n)/(D(n)\times H)$ using $Sp(n)$ calculated in step 602, and then the number obtained by subtracting $Np(n)$ from $Ns(n)$ is allocated equally to the overall wirable area in the LSI (step 606).

Figure 7:
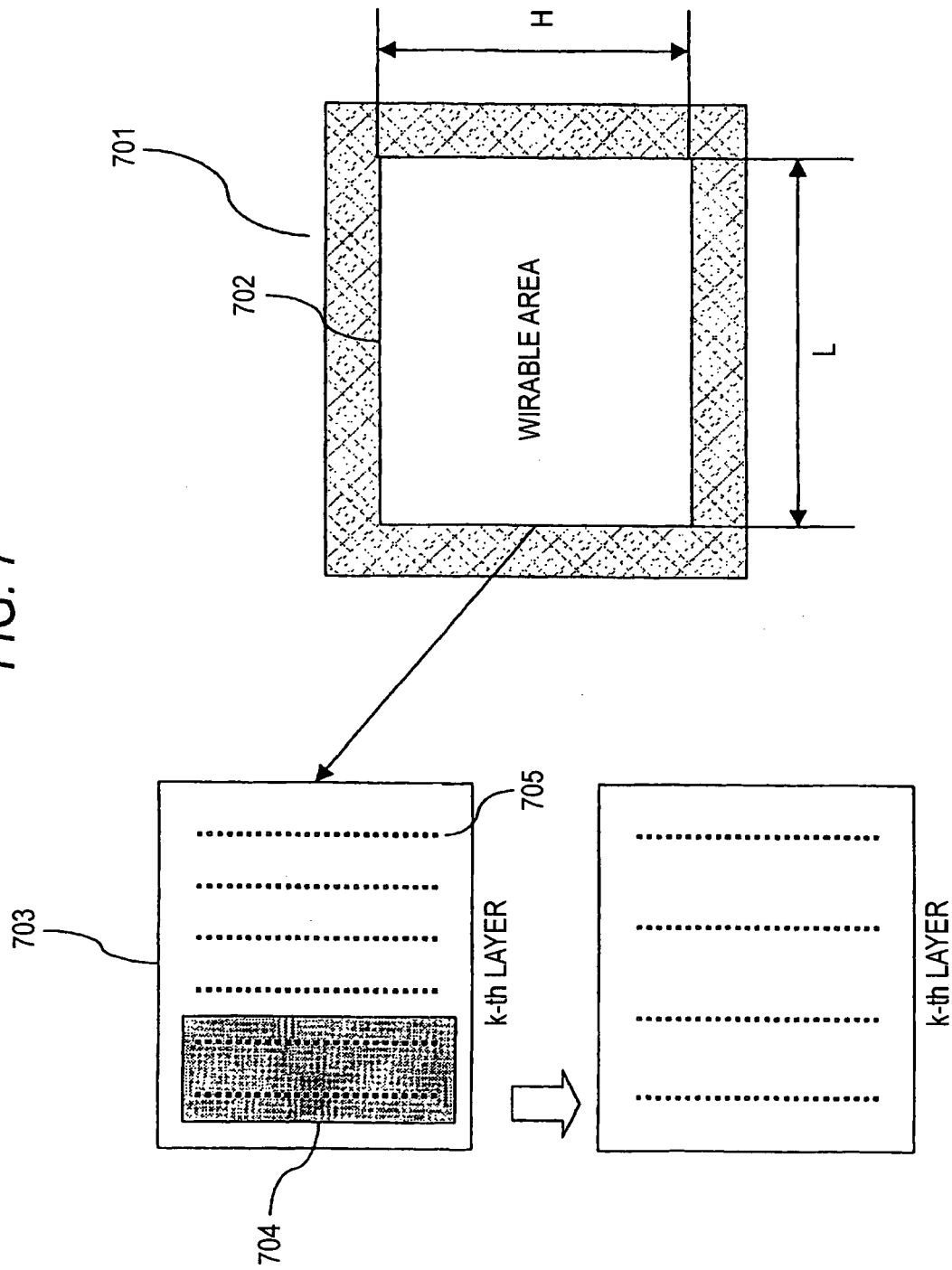
FIG. 7 is a layout view explaining a deletion of the signal wiring routes in Embodiment 4 of the present invention.

FIG. 7 is a view explaining concretely a flow in FIG. 6. A numeral 701 in FIG. 7 denotes an overall space of LSI. A numeral 702 denotes an overall space in which the signal and power-supply wirings can be paid in the overall space 701. Also, the wirable area 702 is stacked every wiring layer. A numeral 703 denotes a wiring layer used in laying the power supply and having the same height H and length L as the wirable area 702. In the present embodiment, the layer used as the power-supply wiring is denoted as the k-th layer.

First, in the present embodiment, under the assumption that a width of the power-supply wiring in each wiring layer is represented by the same value Wp, the predictive whole power-supply space Sp is divided equally into the spaces of respective power-supply wiring layers by $Sp(k)=Sp/n$. Then, the integer portion of $Np(k)=Sp(n)/(D(n)\times H)$ is obtained as the number $Np(k)$ of the wiring tracks that cannot be used as the wiring route, and then the wiring track is deleted from the predictive power-supply wiring space up to the number $Np(k)$. Then, remaining wiring tracks are placed uniformly again in the wirable area.

Then, the signal wirings are connected based on the wiring tracks formed in the above step. Then, the estimation of the complexity degree of the signal wirings is carried out by the approach of estimating the wiring complexity degree similar to Embodiment 1.

Embodiment 5

In the present embodiment, a function and an operation of deleting the signal wiring tracks to estimate a complexity degree of the signal wirings with higher precision than Embodiment 4 will be explained concretely hereunder. FIG. 1 is a flowchart showing the operational procedures of generating the virtual power-supply wirings. As shown in FIG. 1, first the wirable area is extracted from the input layout information of LSI (step 601). Here, a width and a height of the wirable area are set to H and L respectively.

Then, the input predictive power-supply space Sp is divided onto respective wiring layers to which the power-supply wiring is applied, based on information of the wiring layer used as the power-supply wiring (step 602). At this time, as the method of calculating the power-supply space $Sp(n)$ used in each layer, the space that is proportional to the power-supply width is allocated to respective wiring layers by $Sp(n)=Sp\times Wp(n)/n$, where $Wp(n)$ is the input predictive power-supply wiring width of respective layers and n is the total number of the used power-supply wirings.

Subsequently, the estimation of the complexity degree of the signal wirings is carried out by the same approach as Embodiment 4.

Embodiment 6

In the present embodiment, in addition to Embodiment 4, an approach of estimating a complexity degree of the signal wirings when the macroblock exists in the LSI will be explained concretely hereunder. FIG. 1 is a flowchart showing the operational procedures of generating the virtual power-supply wirings. As shown in FIG. 1, first the wirable area is extracted from the input layout information of LSI (step 601). Here, a width and a height of the wirable area are set to H and L respectively.

Then, the input predictive power-supply space Sp is divided onto respective wiring layers to which the power-supply wiring is applied, based on information of the wiring layer used as the power-supply wiring (step 602). At this time, as the method of calculating the power-supply space Sp(n) used in each layer, the power-supply space Sp(n) is calculated by using the approach of allocating the power-supply space into respective layers in Embodiment 4 or 5.

Then, the wiring space contained in the macroblock is deleted from the power-supply space Sp(n) in compliance with the flow in FIG. 4. Then, the estimation of the wiring complexity degree is executed by the same approach as Embodiment 4.

Embodiment 7

Figure 8:
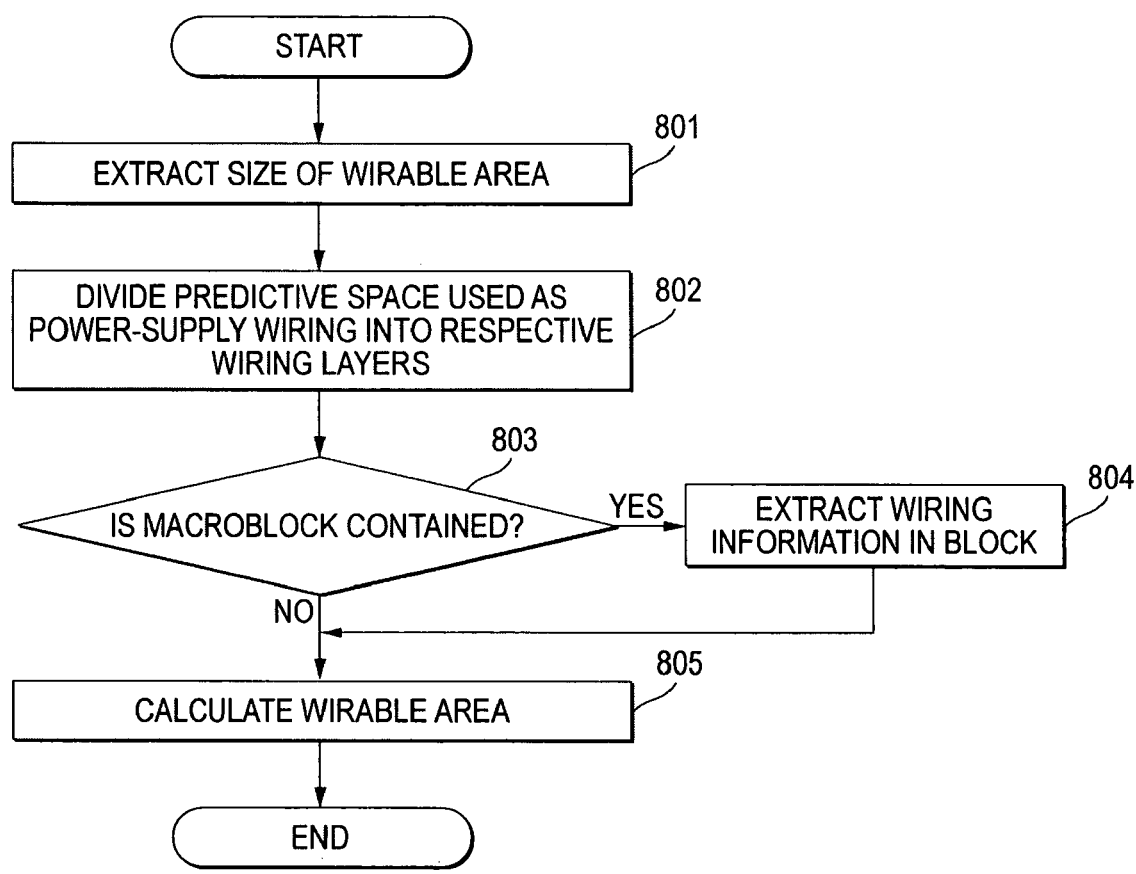
FIG. 8 is a block diagram showing a configuration of a flow in calculating a signal wiring space ratio in Embodiment 7 of the present invention.

In the present embodiment, an approach of estimating a wiring complexity degree by comparing the complexity degree of the signal wirings with the predictive space ratio but not executing the deletion of the virtual power-supply wirings and the signal wiring routes while taking account of the power-supply wiring space when a predictive space ratio of the wirings is input will be explained hereunder. FIG. 8 is a flowchart showing an approach of calculating a signal wiring space ratio. As shown in FIG. 8, first the wirable area is extracted from the input layout information of LSI (step 801). Here, a width and a height of the wirable area are set to H and L respectively.

Then, the input predictive power-supply space Sp is divided onto respective wiring layers to which the power-supply wiring is applied, based on information of the wiring layer used as the power-supply wiring (step 802). At this time, as the method of calculating the power-supply space Sp(n) used in each layer, the power-supply space Sp(n) is divided uniformly by Sp(n)=Wp/n, where n is the total number of the used power-supply wirings.

Then, in step 803, it is decided whether or not the macroblock is present in the LSI as the object. In this embodiment, explanation will be made under the assumption that the macroblock is not present. The case where the macroblock is not present will be explained in Embodiment 9.

Then, a space obtained by subtracting the power-supply space Sp(n) from the wirable area is calculated (step 805). At this stage, the space in which the wirings can be truly provided can be derived from respective wiring layers.

Figure 9:
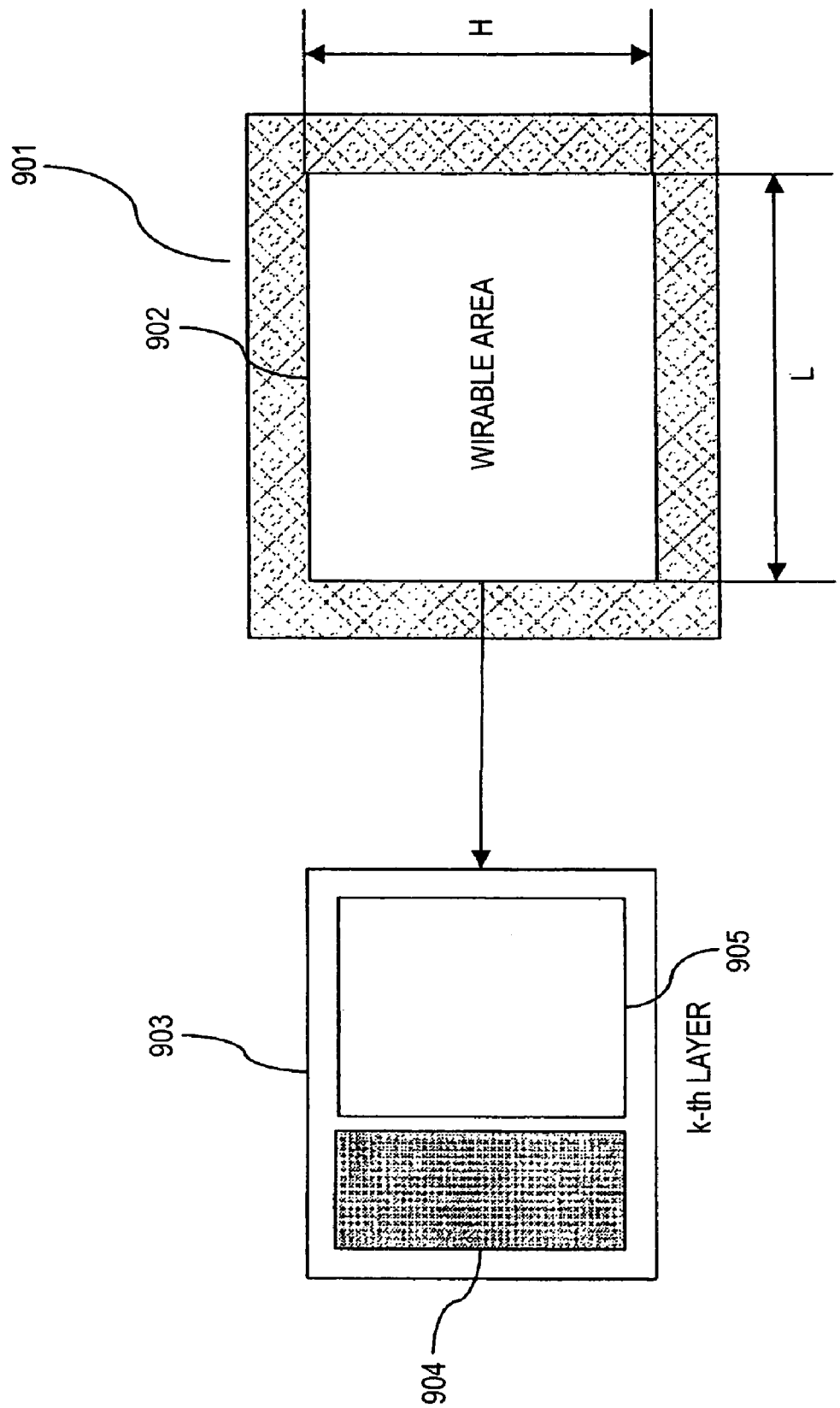
FIG. 9 is a layout view explaining a calculation of the signal wiring space ratio in Embodiment 7 of the present invention.

FIG. 9 is a view explaining concretely a flow in FIG. 8. In FIG. 9, a numeral 901 denotes an overall space of LSI. A numeral 902 denotes an overall space in which the signal and power-supply wirings can be provided in the overall space 901. Also, the wirable area 902 is stacked every wiring layer. A numeral 903 denotes a wiring layer used in laying the power supply and having the same height H and length L as the wirable area 902. In the present embodiment, the layer used as the power-supply wiring is denoted as the k-th layer. First, in the present embodiment, under the assumption that a width of the power-supply wiring in each wiring layer is given by the same value Wp, the space of each power-supply wiring layer is divided into respective wiring layers by Sp(k)=Sp/n using the predictive whole power-supply space Sp, and the divided space of the k-th layer is denoted by 904. Actually this predictive power-supply space 904 out of the area of the wiring layer 903 is used as the power-supply wiring space, the signal wiring cannot be provided thereto. A difference between the wiring layer 903 and the predictive power-supply space 904 is extracted as the signal wiring wirable area (905 in FIG. 9). Then, a difference from the input predictive wiring space ratio is extracted by using the space 905 as the wirable area.

Then, the signal wirings are connected and then, like Embodiment 1, the wiring complexity degree is checked by using a flow of calculating the wiring complexity degree in FIG. 3. At this time, the signal wiring space in respective layers is extracted and then a difference from the input predictive wiring space ratio is calculated by using the signal wiring wirable area in respective layers calculated in step 805. Thus, the complexity degree of the signal wirings is estimated. According to the present embodiment, the estimation of the wiring complexity degree can be carried out with high precision while taking account of the exclusion of the signal wiring connecting area because of the presence of the power-supply wirings.

Embodiment 8

In the present embodiment, a function and an operation of calculating the signal wiring space ratio to estimate a complexity degree of the signal wirings with higher precision than Embodiment 7 will be explained concretely hereunder. FIG. 1 is a flowchart showing the operational procedures of generating the virtual power-supply wirings. As shown in FIG. 1, first the wirable area is extracted from the input layout information of LSI (step 801). Here, a width and a height of the wirable area are set to H and L respectively.

Then, the input predictive power-supply space Sp is divided onto respective wiring layers to which the power-supply wiring is applied, based on information of the wiring layer used as the power-supply wiring (step 802). At this time, as the method of calculating the power-supply space Sp(n) used in each layer, the space that is proportional to the power-supply width is allocated to respective wiring layers by Sp(n)=Sp×Wp(n)/n, where Wp(n) is the input predictive power-supply wiring width of respective layers and n is the total number of the used power-supply wirings.

Subsequently, the estimation of the complexity degree of the signal wirings is carried out by the same approach as Embodiment 7.

Embodiment 9

In the present embodiment, in addition to Embodiment 7, an approach of estimating a complexity degree of the signal wirings when the macroblock exists in the LSI will be explained concretely hereunder. FIG. 1 is a flowchart showing the operational procedures of generating the virtual power-supply wirings. As shown in FIG. 1, first the wirable area is extracted from the input layout information of LSI (step 801). Here, a width and a height of the wirable area are set to H and L respectively.

Then, the input predictive power-supply space Sp is divided onto respective wiring layers to which the power-supply wiring is applied, based on information of the wiring layer used as the power-supply wiring (step 802). At this time, as the method of calculating the power-supply space Sp(n) used in each layer, the power-supply space Sp(n) is calculated by using the approach of allocating the power-supply space into respective layers in Embodiment 7 or 8.

Then, the wiring space contained in the macroblock is deleted from the power-supply space Sp(n) in compliance with the flow in FIG. 8. Then, the estimation of the wiring complexity degree is executed by the same approach as Embodiment 7.

According to the wiring complexity degree estimating method in the semiconductor integrated circuit of the present invention, in the operation of defining the LSI chip size, which cannot be defined after the wiring connection has been made, and the floor plan including the macroblock placement in the course of the development of the recent large-scale LSI, the estimation of the complexity degree of the signal wiring can be carried out with almost same precision attained in a condition that the power-supply wirings have been laid, without actual provision of the power-supply wirings. Therefore, a term required until the LSI chip size and the floor plan are defined while taking even such wiring complexity into consideration can be reduced. As a result, a term required until a product is completed can be reduced, and this estimating method is useful as the technology to estimate the chip size availability in the layout step of the LSI design at an early stage, or the like.

What is claimed is:

1. A method of estimating a wiring complexity degree in a semiconductor integrated circuit with a multi-layered wiring, which has a wiring structure including at least two layers or more, in laying signal wirings, comprising:
   a step of predicting a power-supply wiring space used in the semiconductor integrated circuit;
   a step of dividing the predicted power-supply wiring space onto respective wiring layers; and
   a step of estimating a complexity degree at a time of laying signal wirings, based on the predicted power-supply wiring space and a wiring specification in respective wiring layers,
   wherein the step of estimating the complexity degree includes a step of generating virtual power-supply wirings as a signal wiring inhibiting area based on the wiring specification in respective wiring layers, and estimating the complexity degree at the time of laying the signal wirings based on a size of the signal wiring inhibiting area, and
   wherein the estimating step is the step of estimating the complexity degree at the time of laying the signal wirings, by calculating virtual power-supply wiring laying spaces along the wiring specification in respective wiring layers while using a predictive signal wiring space ratio in respective layers as input information, then adding the virtual power-supply wiring laying spaces to the predictive signal wiring space ratio, and then outputting a difference between a wiring space ratio obtained by considering the predictive power-supply area and an actual wiring space ratio at the time of laying the signal wirings.

2. The method of estimating a wiring complexity degree in a semiconductor integrated circuit, according to claim 1, wherein a power-supply wiring width is different every layer on which the power-supply wiring is laid, and the virtual power-supply wirings are generated as the signal wiring inhibiting area by dividing the predicted power-supply wiring space into power-supply wiring spaces of respective layers at a ratio that corresponds to the width of each layer.

3. The method of estimating a wiring complexity degree in a semiconductor integrated circuit, according to claim 1, wherein wiring layers and spaces that are not used at a time of connecting the signal wirings are calculated as spaces that are not used in laying the signal wirings based on a library in which wiring laying shapes in respective layers of macroblocks are set forth, then the spaces that are not used are deleted from power-supply wiring laying spaces used in respective layers, and then the virtual power-supply wirings are generated as the signal wiring inhibiting area.

4. The method of estimating a wiring complexity degree in a semiconductor integrated circuit, according to claim 1, wherein the estimating step is the step of estimating the complexity degree at the time of laying the signal wirings, by deleting laying routes of the signal wirings, which are supposed to be deleted due to spaces of the power-supply wirings, based on the wiring specification in respective wiring layers.

5. The method of estimating a wiring complexity degree in a semiconductor integrated circuit, according to claim 4, wherein a power-supply wiring width is different every layer on which the power-supply wiring is laid, and then the complexity degree at the time of laying the signal wirings is estimated, by dividing the predicted power-supply wiring space into power-supply wiring spaces of respective layers at a ratio that corresponds to the width of each layer and then deleting the laying routes of the signal wirings that are supposed to be deleted due to spaces of the power-supply wirings.

6. The method of estimating a wiring complexity degree in a semiconductor integrated circuit, according to claim 4, wherein the complexity degree at the time of laying the signal wirings is estimated, by extracting wiring layers and spaces, which are not used at the time of connecting the signal wirings, from a library in which wiring laying spaces in respective layers of macroblocks are set forth, then adding the spaces that are not used to the power-supply space used in respective layers, and then deleting the laying routes of the signal wirings that are supposed to be deleted due to spaces of the power-supply wirings.

7. The method of estimating a wiring complexity degree in a semiconductor integrated circuit, according to claim 1, wherein a power-supply wiring width is different every layer on which the power-supply wiring is laid, and then the complexity degree at the time of laying the signal wirings is estimated, by dividing the predicted power-supply wiring space into the power-supply wiring spaces of respective layers at a ratio that corresponds to the width of each layer, then adding the predictive power-supply wiring space ratio to the predictive signal wiring space ratio, and then outputting a difference between the wiring space ratio obtained by considering the predictive power-supply space and the actual wiring space ratio at the time of laying the signal wirings.

8. The method of estimating a wiring complexity degree in a semiconductor integrated circuit, according to claim 1, wherein the complexity degree at the time of laying the signal wirings is estimated, by extracting wiring layers and spaces, which are not used at the time of connecting the signal wirings, from a library in which wiring laying spaces in respective layers of macroblocks are set forth, then deleting the spaces that are not used from the power-supply spaces used in respective layers, then deleting the predictive signal wiring space ratio from the predictive power-supply wiring space ratio, and then outputting a difference between the wiring space ratio obtained by considering the predictive power-supply space and the actual wiring space ratio at the time of laying the signal wirings.

* * * * *